(12) United States Patent
Kanda et al.

(10) Patent No.: US 7,067,899 B2
(45) Date of Patent: Jun. 27, 2006

(54) SEMICONDUCTOR INTEGRATED CIRCUIT DEVICE

(75) Inventors: Ryo Kanda, Gunma (JP); Shigeaki Okawa, Tochigi (JP); Kazuhiro Yoshitake, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/950,610

(22) Filed: Sep. 27, 2004

(65) Prior Publication Data

US 2005/0077571 A1   Apr. 14, 2005

(30) Foreign Application Priority Data

Sep. 29, 2003   (JP) .................... P. 2003-338867

(51) Int. Cl.
    *H01L 29/00* (2006.01)
(52) U.S. Cl. ............... 257/556; 257/511; 257/512; 257/525; 257/526; 257/557; 257/575
(58) Field of Classification Search ............... None
    See application file for complete search history.

(56) References Cited

U.S. PATENT DOCUMENTS

| 4,038,680 A | * | 7/1977 | Yagi et al. ................... 257/555 |
| 5,455,447 A | * | 10/1995 | Hutter et al. ................ 257/545 |
| 5,798,560 A | * | 8/1998 | Ohkawa et al. .............. 257/555 |
| 6,586,780 B1 | * | 7/2003 | Terashima .................. 257/140 |

FOREIGN PATENT DOCUMENTS

JP   06-104459   4/1994

* cited by examiner

*Primary Examiner*—Andy Huynh
(74) *Attorney, Agent, or Firm*—Fish & Richardson P.C.

(57) ABSTRACT

A semiconductor integrated circuit device according to the invention includes an N-type embedded diffusion region between a substrate and a first epitaxial layer in island regions serving as small signal section. The substrate and the first epitaxial layer are thus partitioned by the N-type embedded diffusion region having supply potential in the island regions serving as small signal section. This structure prevents the inflow of free carriers (electrons) generated from a power NPN transistor due to the back electromotive force of the motor into the small signal section, thus preventing the malfunction of the small signal section.

12 Claims, 6 Drawing Sheets

SEMICONDUCTOR INTEGRATED CIRCUIT DEVICE

BACKGROUND OF THE INVENTION

1. Field of the Invention

The present invention relates to a semiconductor integrated circuit device in which the malfunction of a motor drive circuit due to a parasitic effect is prevented.

2. Description of the Related Art

Conventional three-phase motor drivers have three parallel-connected transistors (Tr1–Tr2, Tr3–Tr4, and Tr5–Tr6) each connected in series between direct-current power supplies VCC and GND. Output terminals taken from between Tr1–Tr2, Tr3–Tr4, and Tr5–Tr6 are connected to a motor M. Thus, normal/back electromotive force is generated as the motor rotates/stops. It is proposed in the art to provide a structure in which a protective diode is connected between the collector and the emitter of the transistors to dissipate the electromotive force to a fixed potential, thereby protecting the interior of an IC including the series transistors (for example, refer to Patent Document: JP-A-6-104459, pp. 13–14, FIGS. 16–17).

Also a conventional normal/reverse rotation control circuit of a DC motor is disclosed (for example, refer to Non patent Document: Hirobumi Miura; "Mechatronics," Ohmsha, Ltd., pp. 204–205)

In the conventional semiconductor integrated circuit devices, for example, during ON to OFF transition of a driver device, backward electromotive force (hereinafter, referred to as back electromotive force) is generated from a motor. Thus a negative potential is applied to the collector region of the driver device for driving the motor by the back electromotive force. Accordingly, free carriers (electrons) are generated from a PN junction between the emitter region and the base region of a parasitic transistor constructed of a driver device, a substrate, and a control device. The free carriers (electrons) flow from an island region having the driver device to the other island regions via the substrate. Particularly, when the free carriers (electrons) flow into the control device for controlling the driver device, the control device fails to function normally. This causes the driver device which should be in OFF action to make ON action to send an incorrect signal, thus interfering with the normal operation of the motor.

SUMMARY OF THE INVENTION

The present invention has been made in consideration of the foregoing problems. A semiconductor integrated circuit device according to the invention includes a plurality of opposite-conductivity-type epitaxial layers deposited on a single-conductivity-type semiconductor substrate, and dividing regions dividing the epitaxial layers into a plurality of island regions. The island regions comprising at least an-sland region incorporating a driver device for driving a motor and at least another island region incorporating a control device for controlling the driver device. A device formed region in the island region having the control device has an opposite-conductivity-type embedded diffusion region between the substrate and a first epitaxial layer deposited on an upper surface of the substrate and a grounded single-conductivity-type embedded diffusion region on the first epitaxial layer. Accordingly, the semiconductor integrated circuit device according to the invention has an opposite-conductivity-type embedded diffusion region between the substrate and the first epitaxial layer in the island region having a control device, and a grounded single-conductivity-type embedded diffusion region on an upper surface of the opposite-conductivity-type embedded diffusion region. Thus free carriers (electrons) generated from the driver device by the back electromotive force of the motor are attracted through the opposite-conductivity-type diffusion region, thus being prevented from flowing into the control device. This prevents the malfunction of the control device due to the free carriers (electrons) generated from the driver device. The single-conductivity-type embedded diffusion region serves as the substrate of the control device.

In the semiconductor integrated circuit device according to the invention, the dividing region dividing the island region having the control device connects to the single-conductivity-type embedded diffusion region; and an uppermost epitaxial layer located in the vicinity of the island region having the control device has an opposite-conductivity-type diffusion region having supply potential. Accordingly, in the semiconductor integrated circuit device according to the invention, also the opposite-conductivity-type embedded diffusion region has supply potential via the opposite-conductivity-type diffusion region having the supply potential. Thus the free carriers (electrons) generated from the driver device by the back electromotive force of the motor are surely attracted through the opposite-conductivity-type diffusion region.

In the semiconductor integrated circuit device according to the invention, the island region having the driver device is surrounded by a single-conductivity-type connected diffusion region. The single-conductivity-type connected diffusion region is grounded. Accordingly, in the semiconductor integrated circuit device of the invention, which has multiple epitaxial layers, the grounded diffusion region serves as the substrate also in the island region having the driver device.

The semiconductor integrated circuit device according to the invention includes a plurality of opposite-conductivity-type epitaxial layers deposited on a single-conductivity-type semiconductor substrate, and dividing regions dividing the substrate and the epitaxial layers into a plurality of island regions. The island regions comprising at least an island region incorporating a driver device for driving a motor and at least another island region incorporating a control device for controlling the driver device. The island region having the driver device has an opposite-conductivity-type embedded diffusion region between the substrate and a first epitaxial layer deposited on an upper surface of the substrate and a grounded single-conductivity-type embedded diffusion region on the first epitaxial layer. Accordingly, the semiconductor integrated circuit device of the invention has an opposite-conductivity-type embedded diffusion region between the substrate and the first epitaxial layer in the island region having a driver device, and a grounded single-conductivity-type embedded diffusion region on an upper surface of the opposite-conductivity-type embedded diffusion region. Thus the free carriers (electrons) generated from the driver device by the back electromotive force of the motor are attracted through the opposite-conductivity-type diffusion region, thus being prevented from flowing into the control device. This prevents the malfunction of the control device due to the free carriers (electrons) generated from the driver device. The single-conductivity-type embedded diffusion region serves as the substrate of the driver device.

The semiconductor integrated circuit device according to the invention includes an island region having a motor-driving device and an island region having a control device for controlling the driver device. A device formed region in the island region having the control device is separated from the substrate by an opposite-conductivity-type embedded diffusion region having supply potential. Thus free carriers (electrons) generated from the PN junction of the driver device by the back electromotive force of the motor are prevented from flowing into the control device by the single-conductivity-type embedded diffusion region. Thus the malfunction of the control device due to the free carriers (electrons) can be prevented and as such, the malfunction of the driver device can be prevented.

The semiconductor integrated circuit device according to the invention includes multiple epitaxial layers on the upper surface of the substrate in the island region having the control device. An opposite-conductivity-type embedded diffusion region having supply potential is disposed between the substrate and the first epitaxial layer. A single-conductivity-type embedded diffusion region is disposed between the first epitaxial layer and an epitaxial layer thereon. The single-conductivity-type embedded diffusion region connects to the dividing region in the island region having the control device. Thus, a grounded single-conductivity-type embedded diffusion region is disposed on the opposite-conductivity-type embedded diffusion region, so that the single-conductivity-type embedded diffusion region can be the diffusion region of a desired impurity concentration. Accordingly, the single-conductivity-type embedded diffusion region can be grounded more reliably and so it serves as the substrate, so that a latch-up phenomenon in the control device can be prevented.

In the semiconductor integrated circuit device according to the invention, the opposite-conductivity-type embedded diffusion region which prevents the free carriers (electrons) generated from the driver device from flowing into the control device and the single-conductivity-type embedded diffusion region which prevents the latch-up phenomenon in the control device are disposed separately in different regions. The embedded diffusion regions can therefore have respective desired impurity concentrations, thus having respective advantages.

DESCRIPTION OF THE PREFERRED EMBODIMENTS

A semiconductor integrated circuit device according to embodiments of the invention will be specifically described with reference to FIGS. 1 to 6.

FIGS. 1 and 3 to 6 are cross-sectional views of the semiconductor integrated circuit device according to embodiments of the invention. FIG. 2 is part of the circuit diagram of the semiconductor integrated circuit device according to the embodiment of the invention.

Figure 1:
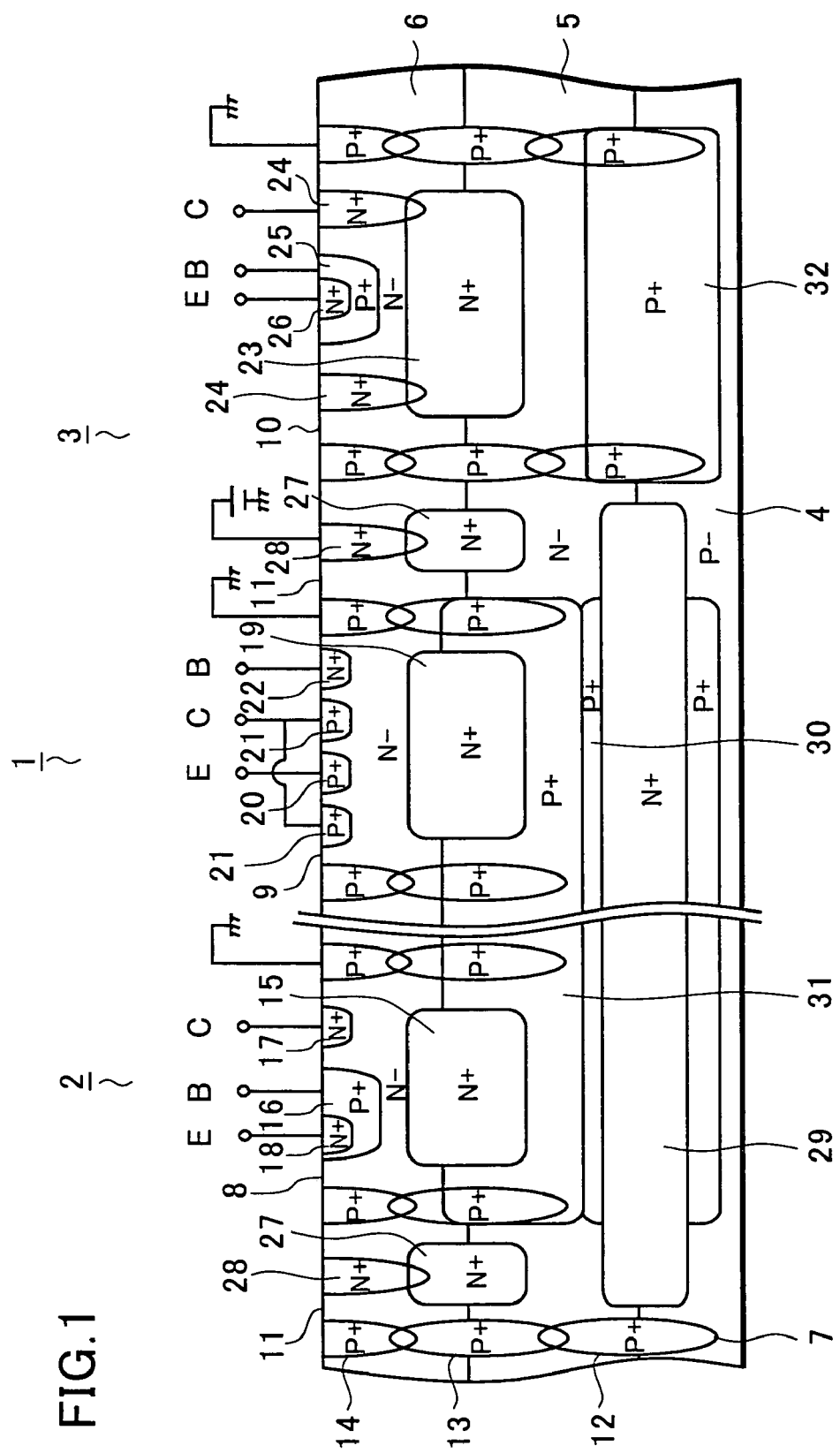
FIG. 1 is a cross-sectional view of a semiconductor integrated circuit device according to an embodiment of the invention.
Figure 2:
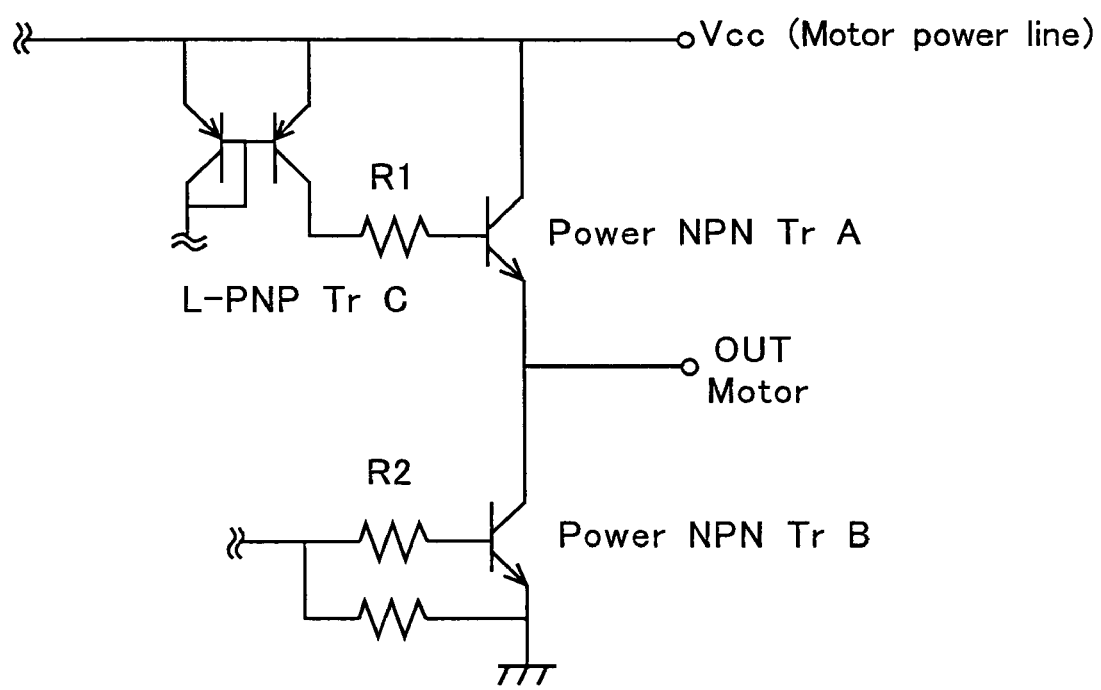
FIG. 2 is a circuit diagram of the semiconductor integrated circuit device according to the embodiment of the invention.

Referring to FIG. 1, a first N-type epitaxial layer 5 in a thickness of, e.g., about 2 to 10 μm is formed on a P-type monocrystal silicon substrate 4. A second N-type epitaxial layer 6 in a thickness of, e.g., about 2 to 10 μm is formed on the first epitaxial layer 5. The substrate 4 and the first and second epitaxial layers 5 and 6 are divided into a first island region 8, a second island region 9, a third island region 10, and a fourth island region 11 by P-type dividing regions 7 which pass therethrough. Although not shown, the substrate 4 and the first and second epitaxial layers 5 and 6 also have the other island regions divided by the dividing regions 7. The other island regions include various devices such as an integrated injection logic (IIL).

Each of the dividing regions 7 includes a first dividing region 12 extending vertically from the surface of the substrate 4, a first dividing region 13 extending vertically from the surface of the first epitaxial layer 5, and a second dividing region 14 extending vertically from the surface of the second epitaxial layer 6. The first dividing region 12, the first dividing region 13, and the second dividing region 14 are joined together to divide the substrate 4 and the first and second epitaxial layers 5 and 6 into islands.

A semiconductor integrated circuit device 1 according to an embodiment of the invention has an NPN transistor and a horizontal PNP transistor which construct a small signal section 2 in the first island region 8 and the second island region 9, and has a power NPN transistor 3 serving as the motor-driving device in the third island region 10. In this embodiment, the fourth island region 11 is constructed to surround the first and second island regions 8 and 9 which construct the small signal section 2.

Although not shown, an LOCOS oxide film, a silicon oxide film, etc. are deposited on the upper surface of the second epitaxial layer 6. A barrier metal layer and an aluminum layer are deposited thereon through contact holes in the silicon oxide film etc., whereby an electrode is formed. The devices formed in the first island region 8, the second island region 9, the third island region 10, and the fourth island region 11 will be described hereinbelow.

The NPN transistor formed in the first island region 8 will first be described. An N-type embedded diffusion region 15 is formed at the boundary between the first and second epitaxial layers 5 and 6, as shown in the FIG. 1. The second epitaxial layer 6 used as collector region has a P-type diffusion region 16 and an N-type diffusion region 17 extending from the surface. For example, the P-type diffusion region 16 is used as base region and the N-type diffusion region 17 is used as collector leading region. An N-type diffusion region 18 extends from the surface of the P-type diffusion region 16. The N-type diffusion region 18 is used as emitter region. Thus the NPN transistor is constructed.

The horizontal PNP transistor formed in the second island region 9 will then be described. An N-type embedded diffusion region 19 is formed at the boundary between the first and second epitaxial layers 5 and 6, as shown in FIG. 1. The second epitaxial layer 6 used as base region has P-type diffusion regions 20 and 21 and an N-type diffusion region 22 extending from the surface. For example, the P-type diffusion region 20 is used as emitter region and the P-type diffusion region 21 is used as collector region. Although the P-type diffusion regions 21 are separated in FIG. 1, they are actually integrated so as to surround the P-type diffusion region 20. The N-type diffusion region 22 is used as base leading region. Thus the horizontal PNP transistor is constructed.

The power NPN transistor 3 formed in the third island region 10 will then be described. An N-type embedded diffusion region 23 is formed at the boundary between the first and second epitaxial layers 5 and 6, as shown in FIG. 1. N-type diffusion regions 24 extend from the surface of the second epitaxial layer 6. The N-type diffusion regions 24 connect to the N-type embedded diffusion region 23. A P-type diffusion region 25 extending from the surface of the second epitaxial layer 6 is formed in the region between the N-type diffusion regions 24. An N-type diffusion region 26 extends from the surface of the P-type diffusion region 25. In this embodiment, the second N-type epitaxial layer 6 is used as collector region. The N-type embedded diffusion region 23 and the N-type diffusion region 24 are used as collector leading region. The P-type diffusion region 25 is used as base region and the N-type diffusion region 26 is used as emitter region. Thus the power NPN transistor 3 is constructed.

In this embodiment, an NPN transistor carrying a main current of about several milliamperes is referred to as an NPN transistor; an NPN transistor carrying a main current of about several amperes is referred to as a power NPN transistor.

An N-type diffusion region having supply potential formed in the fourth island region 11 will be described. An N-type embedded diffusion region 27 is formed in the boundary between the first and second epitaxial layers 5 and 6, as shown in FIG. 1. An N-type diffusion region 28 extends from the surface of the second epitaxial layer 6. The N-type embedded diffusion region 27 and the N-type diffusion region 28 are connected together. Supply voltage is applied to the N-type diffusion region 28. Accordingly, free carriers (electrons) generated when back electromotive force of a motor is applied to the power NPN transistor 3 can be attracted.

The fourth island region 11 must not necessarily be constructed to surround the small signal section 2, as described above. For example, the fourth island region 11 maybe disposed for each of the island regions of the small signal section 2. In that case, the N-type diffusion region having supply potential may be disposed at any position in the fourth island region 11.

As described above, in the embodiment, the fourth island region 11 is disposed to surround the first and second island regions 8 and 9 which construct the small signal section 2. The first, second, and fourth island regions 8, 9, and 11 have an N-type embedded diffusion region 29 at the boundary between the substrate 4 and the first epitaxial layer 5. With such a structure, the substrate 4 and the first epitaxial layer 5 are partitioned by the N-type embedded diffusion region 29 in the first and second island regions 8 and 9 serving as the small signal section 2. The fourth island region 11 having the N-type embedded diffusion region 29 has N-type diffusion regions 27 and 28 having supply potential on the surface thereof. Thus, according to the embodiment, the region of the small signal section 2 is partitioned into the substrate 4 and the first epitaxial layer 5 by the N-type embedded diffusion region 29 having supply potential.

In this embodiment, the N-type embedded diffusion region 29 and the N-type embedded diffusion region 27 may connect together in the fourth island region 11. This structure ensures application of supply potential to the N-type embedded diffusion region 29.

In this embodiment, the first and second island regions 8 and 9 which construct the small signal section 2 have a P-type embedded diffusion region 30 at the boundary between the substrate 4 and the first epitaxial layer 5, as shown in FIG. 1, in which case the region of the P-type embedded diffusion region 30 has the N-type embedded diffusion region 29. The P-type embedded diffusion region 30 is therefore formed so as to be led out from the upper surface and the lower surface of the N-type embedded diffusion region 29.

The first and second island regions 8 and 9 which construct the small signal section 2 have a P-type embedded diffusion region 31 at the boundary between the first and second epitaxial layers 5 and 6. The P-type embedded diffusion region 31 connects to the dividing regions 7 in the island regions of the small signal section 2. Thus the N-type embedded diffusion region 29 having supply potential is disposed at the boundary between the substrate 4 and the first epitaxial layer 5. The P-type embedded diffusion region 31 is grounded via the dividing regions 7 to serve as the substrate 4. The P-type embedded diffusion region 31 also connects to the P-type embedded diffusion region 30 at the bottom.

Briefly, according to the embodiment, the N-type embedded diffusion region 29 having supply potential is disposed at the boundary between the substrate 4 and the first epitaxial layer 5 in the first and second island regions 8 and 9 serving as the small signal section 2. The grounded P-type embedded diffusion region 31 is disposed at the boundary between the first and second epitaxial layers 5, 6. Since the N-type embedded diffusion region 29 and the P-type embedded diffusion region 31 are disposed separately at different regions, they can be the diffusion regions of desired impurity concentrations.

Accordingly, supply potential is applied to the N-type embedded diffusion region 29. This can prevent free carriers (electrons) generated from the power NPN transistor 3 from flowing into the small signal section 2, which will be described later in detail. This prevents the malfunction of the small signal section 2 due to the free carriers (electrons). The P-type embedded diffusion region 31 can be surely grounded by having a desired impurity concentration. Thus the P-type embedded diffusion region 31 serves as the substrate of the power NPN transistor 3, thereby preventing a latch-up phenomenon.

Although the region of the N-type embedded diffusion region 29 has the P-type embedded diffusion region 30, as described above, the P-type embedded diffusion region 30 may either be disposed or not. However, when the P-type embedded diffusion region 30 is provided and connected to the P-type embedded diffusion region 31, the P-type embedded diffusion region 31 is grounded more reliably.

FIG. 2 shows part of a circuit diagram of the semiconductor integrated circuit device 1 according to the embodiment, serving as driver IC for driving a motor. For example, the power line for driving a motor connects to the collector electrode of a power NPN transistor A serving as a motor-driving device. The emitter electrode of the power NPN transistor A and the output terminal of the motor are connected together. The collector electrode of a horizontal PNP transistor C serving as control device and the base electrode of the power NPN transistor A are connected via a resistor R1. The emitter electrode of the horizontal PNP transistor C connects to the power line. The base electrode of the horizontal PNP transistor C connects to, for example, the base electrode of the other horizontal PNP transistor serving as current mirror circuit and then connects to the power line via the other horizontal PNP transistor.

With such a circuit structure, during ON to OFF transition of the power NPN transistor 3 serving as driver device, for example, a negative potential is applied to the collector region of the power NPN transistor 3 by the back electromotive force of the motor. The third island region 10 having the power NPN transistor 3 has a P-type embedded diffusion region 32 at the boundary between the substrate 4 and the first epitaxial layer 5. Since the P-type embedded diffusion region 32 connects to the dividing region 7 that partitions the third island region 10, it is grounded.

Accordingly, in the third island region 10, the parasitic NPN transistor including the first N-type epitaxial layer 5, the P-type substrate 4, the P-type embedded diffusion region 32, and the N-type embedded diffusion region 29 of the small signal section 2 is forward-biased at the junction between the emitter region and the base region (hereinafter, referred to as a parasitic junction). Thus free carriers (electrons) are generated from the parasitic junction.

According to the embodiment, however, with the foregoing device structure, the free carriers (electrons) generated from the parasitic junction of the power NPN transistor 3 are prevented from flowing into the small signal section 2 through the substrate 4. Specifically, the N-type embedded diffusion region 29 partitions the substrate 4 and the first epitaxial layer 5 from each other in the island regions 8 and 9 having the small signal section 2. The N-type embedded diffusion region 29 and the N-type diffusion regions 27 and 28 are disposed close to one another. In other words, the small signal section 2 is substantially partitioned from the substrate 4 in the N-type embedded diffusion region 29 having supply potential.

Thus, when the back electromotive force is generated from the motor, the free carriers (electrons) generated from the power NPN transistor 3 pass through the substrate 4 into the N-type embedded diffusion region 29 having supply potential. The flowing free carriers (electrons) are attracted through the N-type diffusion regions 27 and 28 in the fourth island region 11. At that time, the N-type embedded diffusion region 29 and the second epitaxial layer 6 are separated from each other by the grounded P-type embedded diffusion region 31 in the island regions 8 and 9 having the small signal section 2.

This prevents the inflow of the free carriers (electrons) into the NPN transistor and the horizontal PNP transistor which construct the small signal section 2, thus preventing a malfunction that the transistors turn on in OFF mode. This prevents the power NPN transistor 3 serving as driver device from turning on in OFF mode due to the malfunction of the NPN transistor and the horizontal PNP transistor serving as the small signal section 2.

Figure 3:
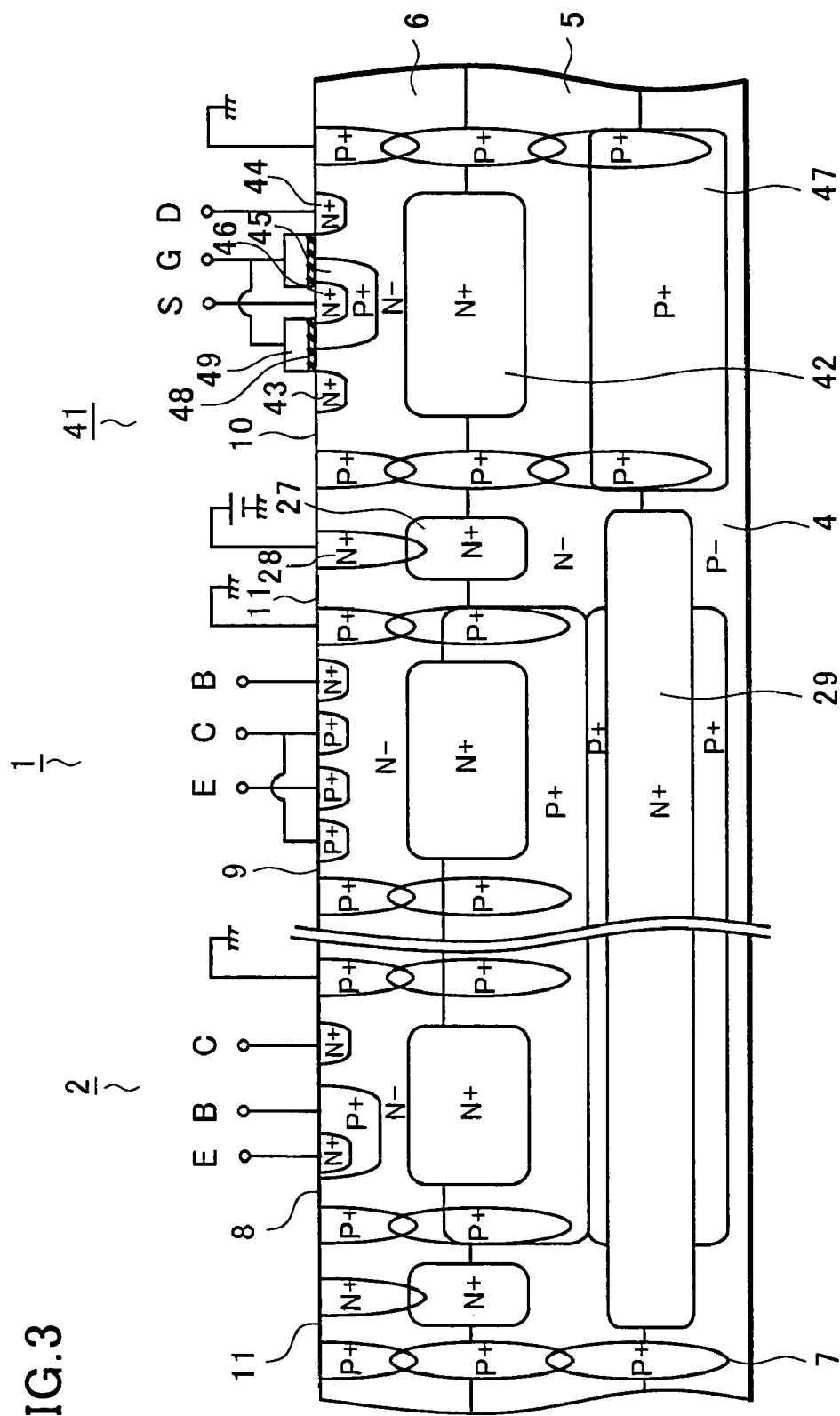
FIG. 3 is a cross-sectional view of a semiconductor integrated circuit device according to another embodiment of the invention.

Referring to FIG. 3, in this embodiment, a power MOS transistor 41 may be used as the motor-driving device. Since the devices disposed in the first island region 8, the second island region 9, and the fourth island region 11 are the same as those of FIG. 1, their description will be omitted here. The same components as those in the semiconductor integrated circuit device of FIG. 1 will be given the same reference numerals in the following description.

The first N-type epitaxial layer 5 in a thickness of, e.g., about 2 to 10 μm is deposited on the P-type monocrystal silicon substrate 4. The second N-type epitaxial layer 6 in a thickness of, e.g., about 2 to 10 μm is deposited on the first epitaxial layer 5. The substrate 4 and the first and second epitaxial layers 5 and 6 are divided into the first island region 8, the second island region 9, the third island region 10, and the fourth island region 11 by the P-type dividing regions 7 which pass therethrough. As shown in FIG. 1, the first island region 8 has an NPN transistor and the second island region 9 has a horizontal PNP transistor. The devices disposed in the island regions 8 and 9 construct the small signal section 2.

In this embodiment, the power MOS transistor 41 may be used as the motor-driving device. The third island region 10 has an N-type embedded diffusion region 42 at the boundary between the first and second epitaxial layers 5 and 6, as shown in FIG. 3. N-type diffusion regions 43 and 44 and a P-type diffusion region 45 extend from the surface of the second epitaxial layer 6. The P-type diffusion region 45 has an N-type diffusion region 46 on the surface thereof. The second epitaxial layer 6 has a gate electrode 49 on the surface thereof via a gate oxide film 48. The power MOS transistor 41 of this embodiment is constructed such that the N-type diffusion regions 43 and 44 are used as drain region, the N-type diffusion region 46 as source region, and the P-type diffusion region 45 as channel region. As in the structure of FIG. 1, the third island region 10 having the power MOS transistor 41 has a P-type embedded diffusion region 47 at the boundary between the substrate 4 and the first epitaxial layer 5. Since the P-type embedded diffusion region 47 connects to the dividing region 7 that partitions the third island region 10, it is grounded.

In the embodiment, a transistor carrying a maim current of, e.g., about several amperes is referred to as a power MOS transistor.

In this embodiment, also when the power MOS transistor 41 is used as the motor-driving device, a negative potential is applied to the drain region of the power MOS transistor 41 serving as driver device by the back electromotive force of the motor during ON to OFF transition of the power MOS transistor 41, as with the power NPN transistor 3. In the third island region 10, the parasitic NPN transistor including the N-type epitaxial layer 5, the P-type substrate 4, the P-type embedded diffusion region 47, and the N-type embedded diffusion region 29 of the small signal section 2 is forward-biased at the junction between the emitter region and the base region (hereinafter, referred to as a parasitic junction). Thus free carriers (electrons) are generated from the parasitic junction.

With the foregoing device structure of the embodiment, however, the free carriers (electrons) generated from the parasitic junction of the power MOS transistor 41 are prevented from flowing into the small signal section 2 through the substrate 4. This prevents the inflow of the free carriers (electrons) into the NPN transistor and the horizontal PNP transistor which construct the small signal section 2, thus preventing a malfunction that the transistors turn on in OFF mode. Accordingly, the power MOS transistor 41 serving as driver device is prevented from turning on in OFF mode due to the malfunction of the NPN transistor and the horizontal PNP transistor serving as the small signal section 2.

Figure 4:
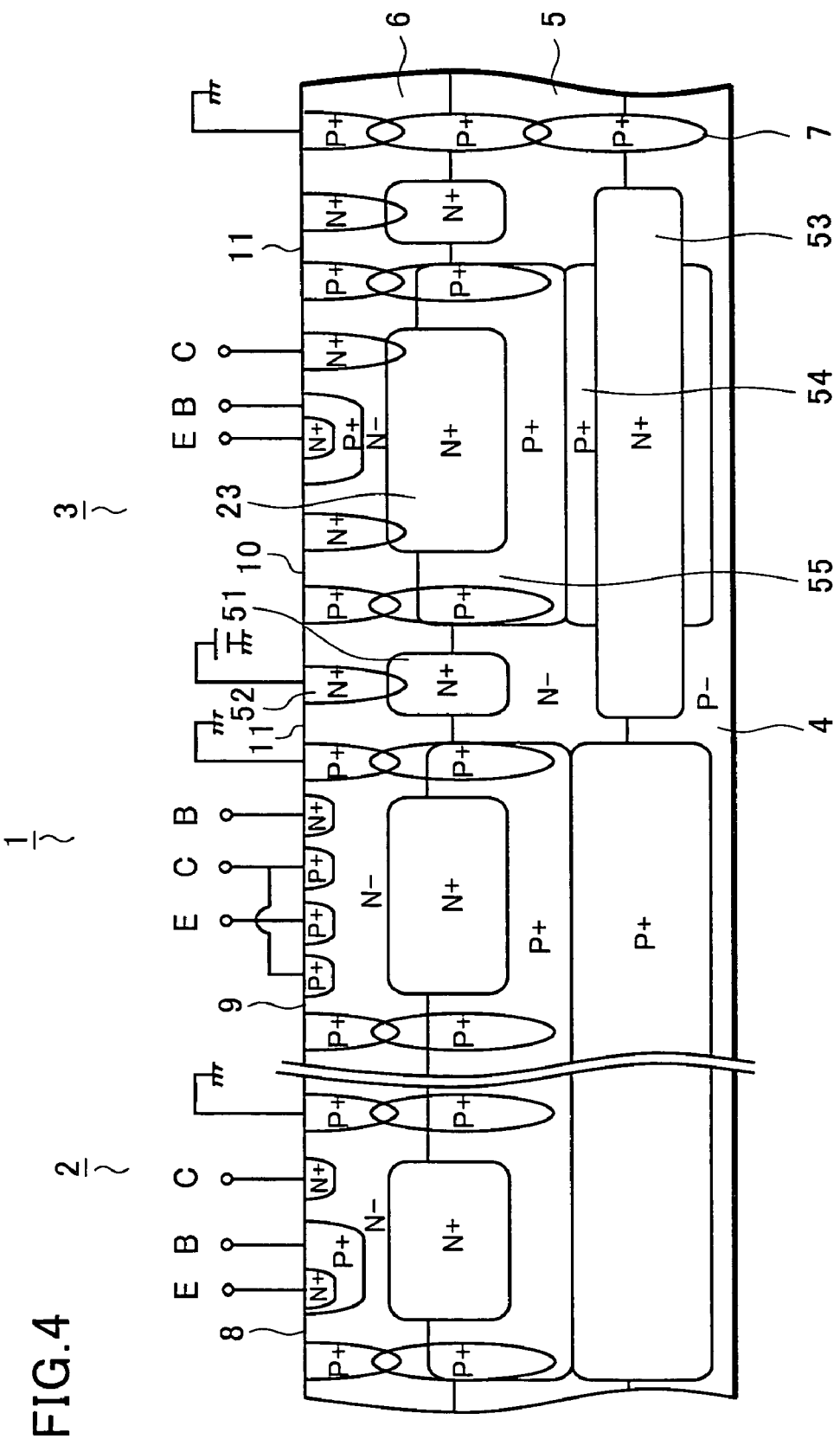
FIG. 4 is a cross-sectional view of a semiconductor integrated circuit device according to another embodiment of the invention.

Referring then to FIG. 4, in this embodiment, the power NPN transistor 3 may be used as the motor-driving device, in which the substrate 4 and the first epitaxial layer 5 in the island region of the driver device may be partitioned by an N-type embedded diffusion region having supply potential. Since the devices disposed in the first island region 8, the second island region 9, and the third island region 10 are the same as those of FIG. 1, their description will be referenced here. The same components as those in the semiconductor integrated circuit device 1 of FIG. 1 will be given the same reference numerals in the following description.

The first N-type epitaxial layer 5 in a thickness of, e.g., about 2 to 10 μm is deposited on the P-type monocrystal silicon substrate 4. The second N-type epitaxial layer 6 in a thickness of, e.g., about 2 to 10 μm is deposited on the first epitaxial layer 5. The substrate 4 and the first and second epitaxial layers 5 and 6 are divided into the first island region 8, the second island region 9, the third island region 10, and the fourth island region 11 by the P-type dividing regions 7 which pass therethrough. As shown in FIG. 1, the first island region 8 has an NPN transistor and the second island region 9 has a horizontal PNP transistor. The devices disposed in the island regions 8 and 9 construct the small signal section 2.

In this embodiment, the third island region 10 which constructs the power NPN transistor 3 has an N-type embedded diffusion region 53 at the boundary between the substrate 4 and the first epitaxial layer 5, as shown in FIG. 4. The N-type embedded diffusion region 53 partitions the substrate 4 and the first epitaxial layer 5 from each other in the third island region 10 serving as the power NPN transistor 3. The N-type embedded diffusion region 53 extends to the fourth island region 11. N-type diffusion regions 51 and 52 having supply potential are formed on the upper surface of the fourth island region 11. Thus, in the region of the power NPN transistor 3 in this embodiment, the substrate 4 and the first epitaxial layer 5 are partitioned by the N-type embedded diffusion region 53 having supply potential.

In this embodiment, the N-type embedded diffusion region 53 and the N-type embedded diffusion region 51 may connect to each other in the fourth island region 11. With this structure, the N-type embedded diffusion region 53 has supply potential more reliably.

In this embodiment, as shown in FIG. 4, the P-type embedded diffusion region 54 is disposed at the boundary between the substrate 4 and the first epitaxial layer 5 in the third island region 10 serving as the power NPN transistor 3. In that case, the region of the P-type embedded diffusion region 54 has the N-type embedded diffusion region 53. The P-type embedded diffusion region 54 is led out from the upper and lower surfaces of the N-type embedded diffusion region 53.

A P-type embedded diffusion region 55 is disposed at the boundary between the first and second epitaxial layers 5 and 6 in the third island region 10 serving as the power NPN transistor 3. The P-type embedded diffusion region 55 connects to the dividing region 7 in the third island region 10. Thus, the N-type embedded diffusion region 53 having supply potential is disposed at the boundary between the substrate 4 and the first epitaxial layer 5. The P-type embedded diffusion region 55 is grounded via the dividing region 7. The P-type embedded diffusion region 55 therefore serves as the substrate of the power NPN transistor 3. The P-type embedded diffusion region 55 also connects to the P-type embedded diffusion region 54 at the bottom thereof.

Briefly, in this embodiment, the N-type embedded diffusion region 53 having supply potential is disposed at the boundary between the substrate 4 and the first epitaxial layer 5 in the third island region 10. The grounded P-type embedded diffusion region 55 is disposed at the boundary between the first and second epitaxial layers 5 and 6. Since the N-type embedded diffusion region 53 and the P-type embedded diffusion region 55 are disposed separately in different regions, they can be the diffusion regions of desired impurity concentrations.

According to the embodiment, during ON to OFF transition of the power NPN transistor 3 serving as driver device, for example, a negative potential is applied to the collector region of the power NPN transistor 3 by the back electromotive force of the motor, as described above. In the third island region 10, the parasitic NPN transistor including the N-type embedded diffusion region 23 of the power NPN transistor 3, the P-type embedded diffusion regions 54 and 55, and the N-type embedded diffusion region 53 is forward-biased at the junction between the emitter region and the base region (hereinafter, referred to as a parasitic junction). Thus free carriers (electrons) are generated from the parasitic junction.

However, since the third island region 10 is surrounded by the N-type diffusion regions 51, 52, and 53 having supply potential, the free carriers (electrons) are attracted from the N-type diffusion regions 51, 52, and 53. Briefly, the free carriers (electrons) generated from the third island region 10 are prevented from flowing into the island region of the small signal section 2. This prevents free carriers (electrons) from flowing into the NPN transistor and the horizontal PNP transistor of the small signal section 2, thus preventing a malfunction that the transistors turn on in OFF mode. Accordingly, the power NPN transistor 3 serving as driver device is prevented from turning on in OFF mode due to the malfunction of the NPN transistor and the horizontal PNP transistor of the small signal section 2.

Figure 5:
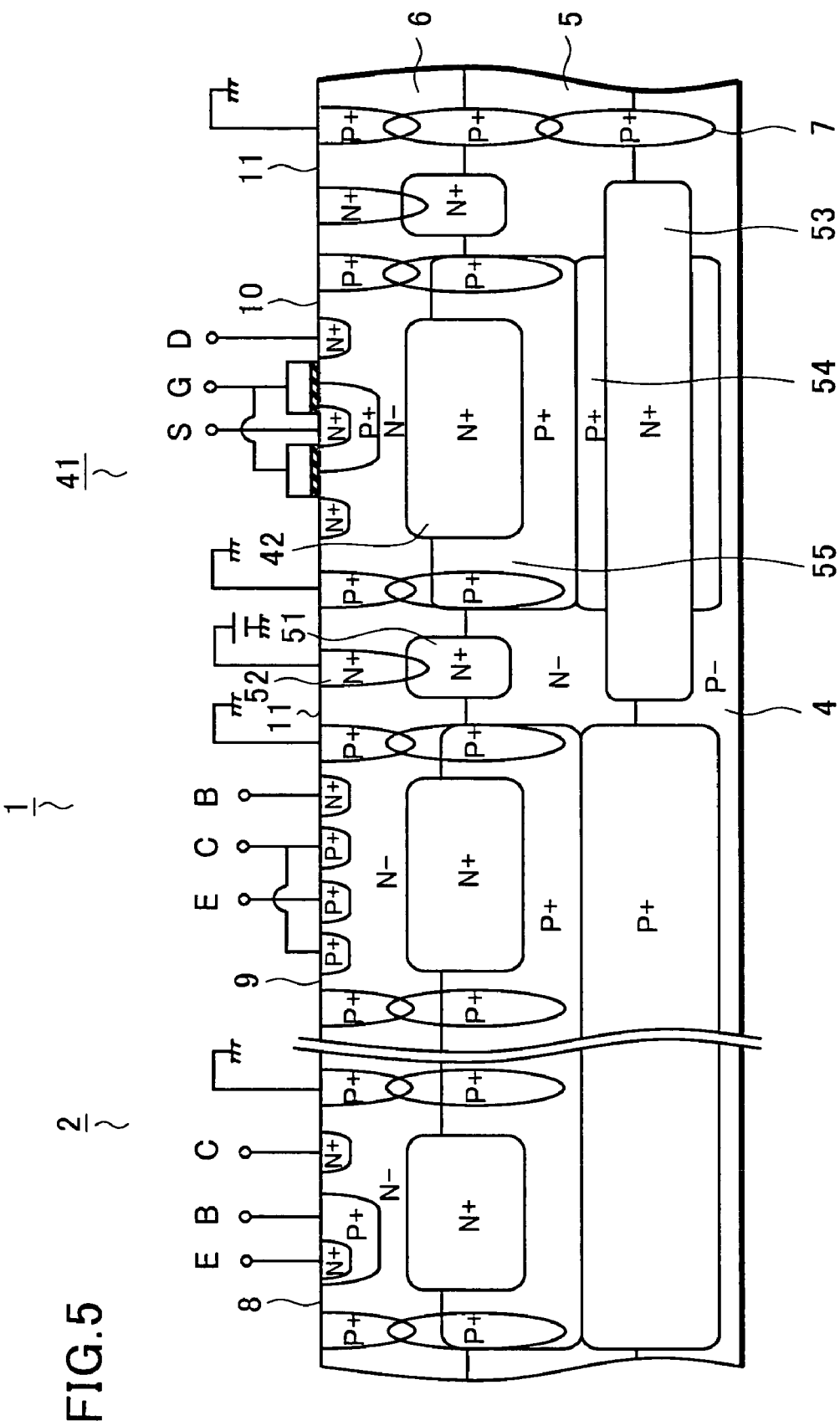
FIG. 5 is a cross-sectional view of a semiconductor integrated circuit device according to another embodiment of the invention.

Referring to FIG. 5, in this embodiment, the power MOS transistor 41 may be used as the motor-driving device in the semiconductor integrated circuit device 1 of FIG. 4. Since the devices disposed in the first island region 8, the second island region 9, and the fourth island region 11 are the same as those of FIG. 4, their description will be omitted here. The same components as those in the semiconductor integrated circuit device of FIGS. 1, 3 and 4 will be given the same reference numerals in the following description.

The first N-type epitaxial layer 5 in a thickness of, e.g., about 2 to 10 μm is deposited on the P-type monocrystal silicon substrate 4. The second N-type epitaxial layer 6 in a thickness of, e.g., about 2 to 10 μm is deposited on the first epitaxial layer 5. The substrate 4 and the first and second epitaxial layers 5 and 6 are divided into the first island region 8, the second island region 9, the third island region 10, and the fourth island region 11 by the P-type dividing regions 7 which pass therethrough. As shown in FIG. 1, the first island region 8 has an NPN transistor and the second island region 9 has a horizontal PNP transistor. The devices disposed in the island regions 8 and 9 construct the small signal section 2.

In this embodiment, as shown in FIG. 4, the N-type embedded diffusion region 53 is disposed at the boundary between the substrate 4 and the first epitaxial layer 5 in the third island region 10 serving as the power MOS transistor 41. With such a structure, the substrate 4 and the first epitaxial layer 5 are partitioned by the N-type embedded diffusion region 53 in the third island region 10 serving as the power MOS transistor 41. The N-type embedded diffusion region 53 extends to the fourth island region 11. The fourth island region 11 has N-type diffusion regions 51 and 52 having supply potential on the upper surface thereof. Thus, in the region of the power MOS transistor 41, the substrate 4 and the first epitaxial layer 5 are substantially partitioned by the N-type embedded diffusion region 53 having supply potential.

In this embodiment, the N-type embedded diffusion region 53 and the N-type embedded diffusion region 51 may connect to each other in the fourth island region 11. With such a structure, the N-type embedded diffusion region 53 has supply potential more reliably.

As has been described with reference to FIG. 4, the P-type embedded diffusion region 54 is disposed at the boundary between the substrate 4 and the first epitaxial layer 5 in the third island region 10. The P-type embedded diffusion region 55 is disposed at the boundary between the first and second epitaxial layers 5 and 6. The P-type embedded diffusion region 55 connects to the dividing region 7 in the third island region 10. Thus, in this embodiment, the N-type embedded diffusion region 53 having supply potential is disposed at the boundary between the substrate 4 and the first epitaxial layer 5. The P-type embedded diffusion region 55 is grounded via the dividing region 7 and serves as the substrate of the power MOS transistor 41. The P-type embedded diffusion region 55 connects also to the P-type embedded diffusion region 54 at the bottom.

Briefly, in this embodiment, the N-type embedded diffusion region 53 having supply potential is disposed at the boundary between the substrate 4 and the first epitaxial layer 5 in the third island region 10; the grounded P-type embedded diffusion region 55 is disposed at the boundary between the first and second epitaxial layers 5 and 6. Since the N-type embedded diffusion region 53 and the P-type embedded diffusion region 55 are disposed separately in different regions, they can be the diffusion regions of desired impurity concentrations.

According to the embodiment, during ON to OFF transition of the power MOS transistor 41 serving as driver device, for example, a negative potential is applied to the drain region of the power MOS transistor 41 by the back electromotive force of the motor, as described above. In the third island region 10, the parasitic NPN transistor including the N-type embedded diffusion region 42 of the power MOS transistor 41, the P-type embedded diffusion regions 54 and 55, and the N-type embedded diffusion region 53 is forward-biased at the junction between the emitter region and the base region (hereinafter, referred to as a parasitic junction). Thus free carriers (electrons) are generated from the parasitic junction.

However, the N-type embedded diffusion region 53 having supply potential substantially partitions the substrate 4 and the first epitaxial layer 5 in the third island region 10. The generated free carriers (electrons) are attracted from the N-type diffusion regions 51, 52, and 53. In other words, the free carriers (electrons) generated from the third island region 10 are prevented from flowing into the island region of the small signal section 2. This prevents free carriers (electrons) from flowing into the NPN transistor and the horizontal PNP transistor of the small signal section 2, thus preventing a malfunction that the transistors turn on in OFF mode. Accordingly, the power MOS transistor 41 serving as driver device is prevented from turning on in OFF mode due to the malfunction of the NPN transistor and the horizontal PNP transistor of the small signal section 2.

Figure 6:
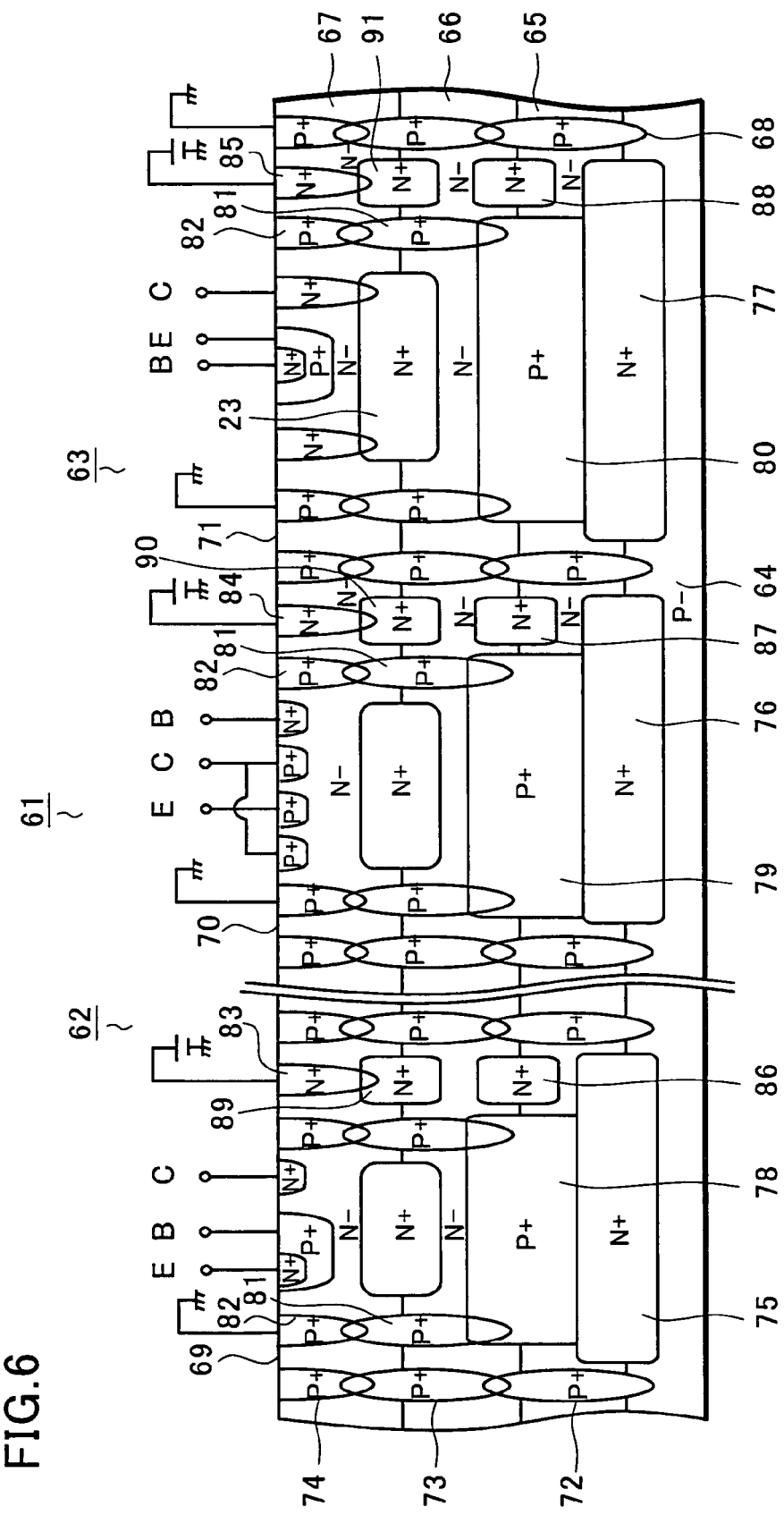
FIG. 6 is a cross-sectional view of a semiconductor integrated circuit device according to another embodiment of the invention.

Referring then to FIG. 6, in this embodiment, the foregoing parasitic-effect prevention measures may be used for each of the devices such as a power NPN transistor 63 serving as the motor-driving device and an NPN transistor and a horizontal PNP transistor of a small signal section 62.

A first N-type epitaxial layer 65 in a thickness of, e.g., about 2 to 10 µm is deposited on a P-type monocrystal silicon substrate 64, as shown in FIG. 6. A second N-type epitaxial layer 66 in a thickness of, e.g., about 2 to 10 µm and an N-type third epitaxial layer 67 in a thickness of, e.g., about 2 to 10 µm are deposited on the first epitaxial layer 65. The substrate 64 and the first, second, and third epitaxial layers 65, 66, and 67 are divided into a first island region 69, a second island region 70, and a third island region 71 by P-type dividing regions 68 which pass therethrough. Although not shown, the substrate 64 and the first, second, and third epitaxial layers 65, 66, and 67 have other island regions portioned by the dividing regions 68. The other island regions have various devices such as an integrated injection logic (IIL).

The dividing regions 68 each include a first dividing region 72 extending vertically from the surface of the first epitaxial layer 65, a second dividing region 73 extending vertically from the surface of the second epitaxial layer 66, and a third dividing region 74 extending from the surface of the third epitaxial layer 67. The dividing regions 72, 73, and 74 connect together to divide the substrate 64, and the first, second, and third epitaxial layers 65, 66, and 67 into islands.

The semiconductor integrated circuit device 61 according to this embodiment has the NPN transistor and the horizontal PNP transistor serving as the small signal section 62 in the first and second island regions 69 and 70, and has a power NPN transistor 63 serving as the motor-driving device in the third island region 71. Although not shown, an LOCOS oxide film, a silicon oxide film, etc. are deposited on the upper surface of the third epitaxial layer 67. A barrier metal layer and an aluminum layer are deposited through contact holes in the silicon oxide film etc., whereby an electrode is formed.

Descriptions on the PNP transistor formed in the first island region 69, the horizontal PNP transistor formed in the second island region 70, and the power NPN transistor 63 formed in the third island region 71 will be omitted here, with reference to FIG. 1. Alternatively, a power MOS transistor may be used as the motor-driving device.

In this embodiment, N-type embedded diffusion regions 75, 76, and 77 are disposed at the boundary between the substrate 64 and the first epitaxial layer 65 in the first, second, and third island regions 69, 70, and 71, respectively. P-type embedded diffusion regions 78, 79, and 80 are disposed at the boundary between the first and second epitaxial layers 66 and 67 in the first, second, and third island regions 69, 70, and 71, respectively. The P-type embedded diffusion regions 78, 79, and 80 connect to grounded P-type embedded diffusion region 81 and diffusion region 82 to serve as substrate.

N-type diffusion regions 83, 84, and 85 extend from the surface of the third epitaxial layer 67 between the P-type diffusion region 82 and the dividing region 68 in the first, second, and third island regions 69, 70, and 71, respectively. The N-type diffusion regions 83, 84, and 85 have supply potential. N-type embedded diffusion regions 86, 87, and 88 are disposed at the boundary between the first epitaxial layer 65 and the second epitaxial layer 66. N-type embedded diffusion regions 89, 90, and 91 are disposed at the boundary between the second epitaxial layer 66 and the third epitaxial layer 67. With such a structure, also the N-type embedded diffusion regions 75, 76, and 77 have substantially supply potential.

In this embodiment, the N-type embedded diffusion regions 75, 76, and 77 and the N-type diffusion regions 83, 84, and 85 are not completely connected by the N-type diffusion regions. However, the embodiment of the invention is not limited to that but they may connect together with the N-type diffusion regions. With such a structure, the N-type embedded diffusion regions 75, 76, and 77 have supply potential more reliably.

Also in this embodiment, during ON to OFF transition of the power NPN transistor 63 serving as driver device, for example, a negative potential is applied to the collector region of the power NPN transistor 63 by the back electromotive force of the motor, as described above. In the third island region 71, the parasitic NPN transistor including the N-type epitaxial layer 66, the P-type embedded diffusion region 80, and the N-type embedded diffusion region 77 is forward-biased at the junction between the emitter region and the base region (hereinafter, referred to as a parasitic junction). Thus free carriers (electrons) are generated from the parasitic junction.

However, the N-type embedded diffusion region 77 having supply potential substantially partitions the substrate 64 and the P-type embedded diffusion region 80 in the third island region 71 in which free carriers (electrons) are generated. The free carriers (electrons) generated from the parasitic junction are attracted from the N-type diffusion regions 77, 85, 88, and 91. In other words, the free carriers (electrons) generated from the third island region 71 are prevented from flowing into the island regions 69 and 70 of the small signal section 62. This prevents free carriers (electrons) from flowing into the NPN transistor and the horizontal PNP transistor of the small signal section 62, thus preventing a malfunction that the transistors turn on in OFF mode. Accordingly, the power NPN transistor 63 serving as driver device is prevented from turning on in OFF mode due to the malfunction of the NPN transistor and the horizontal PNP transistor serving as the small signal section 2.

In the first and second island regions 69 and 70 serving as the small signal section 62, even if free carriers (electrons) flow out from the third island region 71 of the power NPN transistor 63, the flowing free carriers (electrons) can be attracted through the N-type diffusion regions 75, 76, 83, 84, 86, 87, 89, and 90 disposed in the island regions 69 and 70 thereof.

Since the N-type embedded diffusion regions 75 and 76 and the P-type embedded diffusion regions 78 and 79 are disposed separately in different regions in the small signal section 62, they can be the diffusion regions of desired impurity concentrations, as distinct from the case in which the diffusion regions are disposed in the same region. This causes the P-type embedded diffusion regions 78 and 79 to be grounded more reliably, preventing a latch-up phenomenon to enhance the function of the small signal section 62.

The embodiments have been described for the case in which the N-type embedded diffusion region having supply potential is disposed between the substrate and the epitaxial layer in the driving-device formed region or, alternatively, between the substrate and the epitaxial layer in the small signal section. However, the embodiment of the invention is not limited to those. For example, the N-type embedded diffusion region may be disposed in each of the driver-device formed region and the control-device formed region or, alternatively, the N-type embedded diffusion region may be disposed in all the regions other than the driver-device formed region. In the embodiments, two or three epitaxial layers are deposited on the upper surface of the substrate. However, the embodiment of the invention is not limited to those. For example, multiple epitaxial layers such as three or four layers maybe deposited on the substrate. Various other modifications can be made in the embodiment of the invention without departing from the sprit and scope thereof.

What is claimed is:

1. A semiconductor integrated circuit device comprising:
  a plurality of opposite-conductivity-type epitaxial layers deposited on a single-conductivity-type semiconductor substrate; and
  dividing regions dividing the epitaxial layers into a plurality of island regions comprising an island region incorporating a driver device for driving a motor and at least another island region incorporating a control device for controlling the driver device, wherein
  the island region having the control device has an opposite-conductivity-type embedded diffusion region between the substrate and a first epitaxial layer deposited on an upper surface of the substrate and a grounded single-conductivity-type embedded diffusion region on the first epitaxial layer.

2. The semiconductor integrated circuit device according to claim 1, wherein:
  the dividing region dividing the island region having the control device connects to the single-conductivity-type embedded diffusion region; and
  an uppermost epitaxial layer located in the vicinity of the island region having the control device has an opposite-conductivity-type diffusion region having supply potential.

3. The semiconductor integrated circuit device according to claim 1 or 2, wherein the island region having the driver device is surrounded by a single-conductivity-type connected diffusion region, the single-conductivity-type connected diffusion region being grounded.

4. A semiconductor integrated circuit device comprising:
  a plurality of opposite-conductivity-type epitaxial layers deposited on a single-conductivity-type semiconductor substrate; and
  dividing regions dividing the epitaxial layers into a plurality of island regions comprising at least an island region incorporating a driver device for driving a motor and at least another island region incorporating a control device for controlling the driver device, wherein
  the island region having the control device has an opposite-conductivity-type embedded diffusion region and a first single-conductivity-type embedded diffusion region between the substrate and a first epitaxial layer deposited on an upper surface of the substrate, the first embedded diffusion region being led out from at least an upper surface of the opposite-conductivity-type embedded diffusion region and being connected to a grounded second single-conductivity-type embedded diffusion region.

5. The semiconductor integrated circuit device according to claim 4, wherein:
  the epitaxial layer on the upper surface of the opposite-conductivity-type embedded diffusion region has a plurality of island regions having the control device; and
  an uppermost epitaxial layer located in the vicinity of the island regions having the control device has an opposite-conductivity-type diffusion region having supply potential.

6. The semiconductor integrated circuit device according to claim 4 or 5, wherein the island region having the driver device has a third single-conductivity-type embedded diffusion region between the substrate and the first epitaxial layer deposited on the upper surface of the substrate, the third single-conductivity-type embedded diffusion region being grounded via the dividing region in the island region having the driver device.

7. A semiconductor integrated circuit device comprising:
  a plurality of opposite-conductivity-type epitaxial layers deposited on a single-conductivity-type semiconductor substrate; and
  dividing regions dividing the substrate and the epitaxial layers into a plurality of island regions comprising at least an island region incorporating a driver device for driving a motor and at least another island region incorporating a control device for controlling the driver device, wherein the island region having the driver device has an opposite-conductivity-type embedded diffusion region between the substrate and a first epitaxial layer deposited on an upper surface of the substrate and a grounded single-conductivity-type embedded diffusion region on the first epitaxial layer.

8. The semiconductor integrated circuit device according to claim 7, wherein:

the dividing region dividing the island region having the driver device connects to the single-conductivity-type embedded diffusion region; and an uppermost epitaxial layer located in the vicinity of the island region having the driver device has an opposite-conductivity-type diffusion region having supply potential.

9. The semiconductor integrated circuit device according to claim 7 or 8, wherein the island region having the control device is surrounded by a single-conductivity-type connected diffusion region, the single-conductivity-type connected diffusion region being grounded.

10. A semiconductor integrated circuit device comprising:

a plurality of opposite-conductivity-type epitaxial layers deposited on a single-conductivity-type semiconductor substrate; and dividing regions dividing the epitaxial layers into a plurality of island regions comprising at least an island region incorporating a driver device for driving a motor and at least another island region incorporating a control device for controlling the driver device, wherein the island region having the driver device has an opposite-conductivity-type embedded diffusion region and a first single-conductivity-type embedded diffusion region between the substrate and a first epitaxial layer deposited on an upper surface of the substrate, the first embedded diffusion region being led out from at least an upper surface of the opposite-conductivity-type embedded diffusion region and being connected to a grounded second single-conductivity-type embedded diffusion region.

11. The semiconductor integrated circuit device according to claim 10, wherein an uppermost epitaxial layer located in the vicinity of the island region having the driver device has an opposite-conductivity-type diffusion region having supply potential.

12. The semiconductor integrated circuit device according to claim 10 or 11, wherein the island region having the control device has a third single-conductivity-type embedded diffusion region between the substrate and the first epitaxial layer deposited on the upper surface of the substrate, the third single-conductivity-type embedded diffusion region being grounded via the dividing region in the island region having the control device.

* * * * *